(12) United States Patent
Kozuru et al.

(10) Patent No.: US 10,811,581 B2
(45) Date of Patent: Oct. 20, 2020

(54) METHOD OF MANUFACTURING SEMICONDUCTOR DEVICE

(71) Applicant: NICHIA CORPORATION, Anan-shi, Tokushima (JP)

(72) Inventors: Kazuma Kozuru, Tokushima (JP); Ryota Okuno, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/442,114

(22) Filed: Jun. 14, 2019

(65) Prior Publication Data

US 2019/0386192 A1 Dec. 19, 2019

(30) Foreign Application Priority Data

Jun. 15, 2018 (JP) ................................. 2018-114812
Dec. 17, 2018 (JP) ................................. 2018-235816

(51) Int. Cl.
*H01L 33/62* (2010.01)
*H01L 33/00* (2010.01)
(Continued)

(52) U.S. Cl.
CPC ............ *H01L 33/62* (2013.01); *H01L 33/005* (2013.01); *H01L 33/10* (2013.01); *H01L 33/50* (2013.01);
(Continued)

(58) Field of Classification Search
CPC ......... H01L 33/50; H01L 33/10; H01L 33/60; H01L 33/005; H01L 33/62; H01S 5/0222; H01S 5/02296; H01S 5/02288; H01S 5/02276; H01S 5/4093; H01S 5/0071; H01S 5/02216
See application file for complete search history.

(56) References Cited

U.S. PATENT DOCUMENTS 7,482,193 B2 * 1/2009 DCamp ................. B81B 7/0038
438/51
2012/0097734 A1 4/2012 Diep
(Continued)

FOREIGN PATENT DOCUMENTS

| JP | 2007-324303 A | 12/2007 |
| JP | 2011-077182 A | 4/2011 |
| JP | 2013-541850 A | 11/2013 |

*Primary Examiner* — Savitri Mulpuri
(74) *Attorney, Agent, or Firm* — Foley & Lardner LLP

(57) ABSTRACT

A method of manufacturing a semiconductor device includes: a solder ball forming step comprising forming a plurality of solder balls at intervals on (i) a surface of a package surrounding a recess, or (ii) a surface of the light-transmissive member facing the surface of the package surrounding the recess (i) the surface of a light-transmissive member, or (ii) the surface of the package, into contact with an upper surface of the solder balls, which are softened, such that an air passage communicating with the recess is formed between the solder balls; and a bonding step comprising reducing a pressure in the recess via the air passage, and thereafter, in a state in which a gas for sealing is injected, heating and pressing the light-transmissive member and the package, to melt the solder balls and bond the light-transmissive member and the package.

14 Claims, 13 Drawing Sheets

(51) Int. Cl.
  *H01L 33/50* (2010.01)
  *H01L 33/60* (2010.01)
  *H01L 33/10* (2010.01)
  *H01S 5/022* (2006.01)
  *H01S 5/00* (2006.01)

(52) U.S. Cl.
  CPC ............... *H01L 33/60* (2013.01); *H01S 5/00* (2013.01); *H01S 5/022* (2013.01); *H01S 5/02288* (2013.01)

(56) References Cited

U.S. PATENT DOCUMENTS

2017/0317467 A1* 11/2017 Miura ................. H01S 5/02288
2018/0166851 A1*  6/2018 Kijima ................ H01S 5/02212
2018/0182928 A1*  6/2018 Namie ................ H01L 25/0753
2019/0203908 A1*  7/2019 Kiyota .................. H01S 5/405
2019/0305512 A1* 10/2019 Kitajima ............. H01S 5/06825

* cited by examiner

METHOD OF MANUFACTURING SEMICONDUCTOR DEVICE

CROSS-REFERENCE TO RELATED APPLICATION

This application claims priority to Japanese Patent Application No. 2018-114812, filed on Jun. 15, 2018, and Japanese Patent Application No. 2018-235816, filed on Dec. 17, 2018, the contents of which are hereby incorporated by reference in their entireties.

BACKGROUND

1. Technical Field

The present disclosure relates to a method of manufacturing a semiconductor device.

2. Description of Related Art

JP 2007-324303 A describes an optical module in which a substrate, on which a photoelectric conversion element (for example, a semiconductor laser or a photodiode) is mounted, and a package are solder-bonded to be sealed hermetically.

SUMMARY

JP 2007-324303 A describes bonding the package and the substrate to each other. When the bonding is performed in a substituted gas instead of a vacuum, moisture or gas remains on the surface of the package or the surface of the substrate. On the other hand, when the bonding is performed in a vacuum, the bonding is performed in a vacuum chamber. In the vacuum chamber, the package and the substrate are not easily bonded to each other with high alignment accuracy.

One object of the present disclosure is to provide a method of manufacturing a semiconductor device in which a light-transmissive member and a package are bonded to each other with high alignment accuracy.

A method of manufacturing a semiconductor device according to one embodiment of the present invention includes sealing at least one semiconductor laser element disposed in a recess defined by a package by covering the recess with a light-transmissive member. The method includes a solder ball forming step of forming a plurality of solder balls at intervals on a surface of the package surrounding the recess where the at least one semiconductor laser element is provided, or on a surface of the light-transmissive member facing the surface of the package surrounding the recess; a pre-securing step of bringing the surface of the light-transmissive member facing the surface of the package surrounding the recess, or the surface of the package surrounding the recess, into contact with an upper surface of the solder balls, which are softened, such that an air passage communicating with the recess are formed between the solder balls, to perform pre-securing; and a bonding step of reducing a pressure in the recess via the air passage, and thereafter, in the state in which a gas for sealing is injected, heating and pressing the light-transmissive member and the package, to melt the solder balls and bond the light-transmissive member and the package.

A method of manufacturing a semiconductor device according to certain embodiments of the present disclosure allows for obtaining a semiconductor device in which a light-transmissive member and a package are bonded with a high alignment accuracy.

DETAILED DESCRIPTION OF EMBODIMENTS

With reference to the drawings, certain embodiments of a method of manufacturing a semiconductor device according to the present disclosure will be described below. The method of manufacturing a semiconductor device according to the embodiments described below includes hermetically sealing a semiconductor laser element disposed in a recess of a package by covering the recess with a light-transmissive member.

First Embodiment

A method of manufacturing a semiconductor device according to a first embodiment will be described in detail below.

An example of a method of manufacturing a semiconductor device including three semiconductor laser elements 1, 2, and 3 will be described below. In the method of manufacturing according to the first embodiment, a semiconductor device including at least one semiconductor laser element is manufactured.

In the method of manufacturing a semiconductor device according to the first embodiment, a package 10, semiconductor laser elements 1, 2, and 3, and a light-transmissive member 20 are provided.

(1) Providing Package 10

Figure 1:
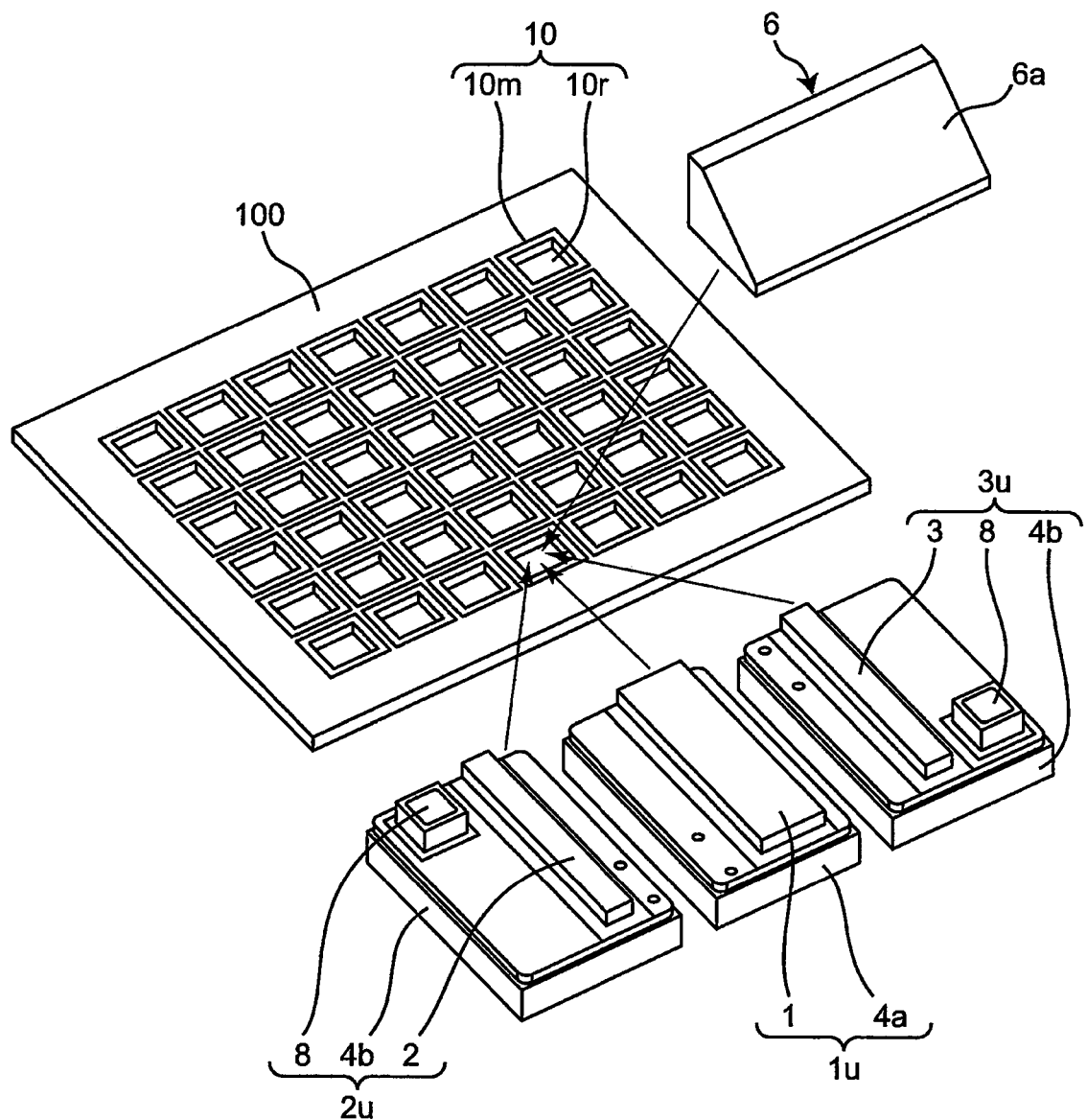
FIG. 1 is a perspective view schematically showing a step of die-bonding in a method of manufacturing a semiconductor device according to a first embodiment of the present disclosure.

A collective substrate 100 in which a plurality of packages 10 is collectively arranged is provided. As shown in FIG. 1, the collective substrate 100 defines recesses 10r at regions each corresponding a respective one of the packages 10 (hereinafter, the plurality of packages 10 collectively arranged may be simply referred to as the "packages"). In each recess 10r, positive and negative wiring electrodes, to which electrodes of the semiconductor laser element are connected, are provided. The wiring electrodes are connected to external terminal electrodes disposed at the lower surface of the package 10 opposite to the recess 10r. In each package 10, a bonding metal film 10m is disposed surrounding the recess 10r. The collective substrate 100 is preferably formed of ceramic having high thermal conductivity, in order to efficiently dissipate heat generated by the semiconductor laser elements, for example. Examples of the ceramic include aluminum oxide, aluminum nitride, silicon nitride, and silicon carbide. For the wiring electrodes and the external terminal electrodes, a metal such as Cu, W, Au, or the like can be used. For the bonding metal film 10m, Au may be used, for example. The collective substrate 100 is provided with a slit for singulation.

(2) Providing Semiconductor Laser Elements 1, 2, 3

For the semiconductor laser elements, for example, three types of the semiconductor laser elements 1, 2, and 3, namely, red, green, and blue (RGB) semiconductor light emitting elements, are provided. The semiconductor laser element 1 is, for example, a laser diode (LD) element emitting red light having peak emission wavelength in a range of 605 nm to 750 nm. Examples of the LD element emitting red light include an InAlGaP-based semiconductor and a GaAs-based semiconductor. The LD element emitting red light preferably includes two or more waveguide regions. With this structure, heat generated due to lasing can be dissipated into a plurality of waveguide regions, so that reduction of output that may be caused by heat generation may be reduced.

Examples of the semiconductor laser element 2 includes an LD element emitting green light having peak emission wavelength in a range of 495 nm to 570 nm. For the LD element emitting green light, an LD element including a GaN-based semiconductor, for example, at least one of GaN, InGaN, and AlGaN, can be used.

The semiconductor laser element 3 may be, for example, an LD element emitting blue light having peak emission wavelength in a range of 420 nm to 494 nm. For the LD element emitting blue light, a LD element including a GaN-based semiconductor, for example, at least one of GaN, InGaN, and AlGaN, can be used.

(3) Mounting Semiconductor Laser Elements 1, 2, and 3 on Submounts 4a, 4b

The semiconductor laser elements 1, 2, and 3 provided as described above are mounted on submounts 4a, 4b. More specifically, the semiconductor laser element 1, which is a GaAs-based laser diode, is, for example, singly mounted on the submount 4a. Each of the semiconductor laser element 2 and the semiconductor laser element 3, which are GaN-based laser diodes, is mounted on a respective one of the submounts 4b with a protective element 8 such as a Zener diode. With each of the semiconductor laser element 2 and each semiconductor laser element 3 connected in parallel to a respective one of the protective elements 8, voltage at a predetermined value or higher can be prevented from being applied to the semiconductor laser elements 2, 3.

The semiconductor laser elements 1, 2, 3 may be mounted on the bottom surface of the recess 10r with or without the submounts 4a, 4b. With the semiconductor laser elements mounted on the bottom surface of the recess 10r via the submounts 4a, 4b the distance between the light emitting point at the light emitting end surface of each semiconductor laser element and the bottom surface of the recess 10r can be increased by the thickness of the submounts 4a, 4b. This allows the light emitted from the LD elements to be efficiently incident on a light-reflecting member 6. The submounts 4a, 4b are provided with wiring electrodes, and the semiconductor laser elements are fixed on the submounts 4a, 4b by a bonding member such as AuSn.

For the submounts 4a, 4b, for example, aluminum nitride, or silicon carbide can be used.

Because crystals such as GaAs has fewer crystal defects than GaN-based crystals and has relatively high electrostatic resistance, the semiconductor laser element 1 is mounted singly on the submount 4a, and each of the semiconductor laser elements 2, 3 is mounted on the submount 4b with the protective element 8.

In the description below, a unit including the submount 4a or 4b and the semiconductor laser element mounted on the submount 4a or 4b is referred to as a "laser unit".

(4) Providing Light-Reflecting Member 6

As shown in FIG. 1, the light-reflecting member 6 has, for example, a substantially triangular prism shape, and has three lateral surfaces one of which serves as a reflecting surface. The reflecting surface of the light-reflecting member 6 reflects laser light to emit the laser light in a predetermined direction. The light-reflecting member 6 is disposed at the bottom surface of the recess 10r so that laser light of each semiconductor laser element is incident on the reflecting surface at a predetermined angle. With the light-reflecting member 6, the direction of light propagating in parallel to the bottom surface of the recess 10r can be changed to a direction perpendicular to the bottom surface of the recess 10r. Thus, laser light emitted from each semiconductor laser element can be emitted parallel to the bottom surface of the recess 10r, which allows for reducing the thickness of the light emitting device.

For the light-reflecting member 6, a base member provided with a reflecting film, or a base member formed of a metal or the like having a high reflectance without a reflecting film can be used. For the base member, a material that has relatively high resistance to heat, such as, quartz, glass such as BK7, or Si can be used. Metal may be used for the base member. For the reflecting film, a metal, a dielectric multilayer film or the like having a high reflectance can be used. The reflecting film may be formed only at the light-reflecting surface. A plurality of the light-reflecting members 6 may be provided.

For example, the light-reflecting members 6, each corresponding to a respective one of the semiconductor laser elements 1, 2, and 3, may be employed.

(5) Providing Light-Transmissive Member 20

The light-transmissive member 20 is transmissive with respect to laser light. The light-transmissive member 20 covers the semiconductor laser element disposed in the recess 10r of the package 10 to hermetically seal the semiconductor laser element. A bonding metal film 20m is disposed at an outer peripheral part of a lower surface of the light-transmissive member 20. The bonding metal film 20m is bonded to the bonding metal film 10m, which is disposed surrounding the recess 10r of the package 10, via solder balls 15, so that the light-transmissive member 20 is fixed to the package 10. Examples of the light-transmissive member 20 include glass with the bonding metal film 20m formed on the glass, and sapphire with the bonding metal film 20m formed on the sapphire. Among these, sapphire with the bonding metal film 20m formed on the sapphire is preferable. For example, because sapphire has relatively high strength and is not easily broken, reliability of hermeticity in the recess 10r, where the semiconductor laser elements are disposed, can be improved. Furthermore, because sapphire has thermal conductivity higher than that of glass, heat is easily transferred in sapphire in a pre-securing step or a bonding step described below, so that solder balls can be easily softened and melted.

In the method of manufacturing a semiconductor device according to the first embodiment, the provided laser units, light-reflecting members, light-transmissive member 20, and the like are mounted in the provided package 10 through the steps described below, so that a light emitting device is manufactured.

1. Mounting

As shown in FIG. 1, in a mounting step, the laser units 1u, 2u, and 3u and the light-reflecting member 6 are mounted on the bottom surface of the recess 10r of each package 10 in the collective substrate 100. For example, these elements are mounted in the configuration as described below. The laser units 1u, 2u, and 3u are disposed so that laser light beams emitted from the semiconductor laser elements 1, 2, and 3 are parallel to one another and parallel to the bottom surface of the recess 10r. The light-reflecting member 6 is disposed so that laser light beams emitted from the semiconductor laser elements 1, 2, 3 are reflected upward by the reflecting surface 6a. Examples of the bonding member used in the mounting include AuSn, Ag particle paste, and Au particle paste.

2. Wire-Bonding

Figure 2:
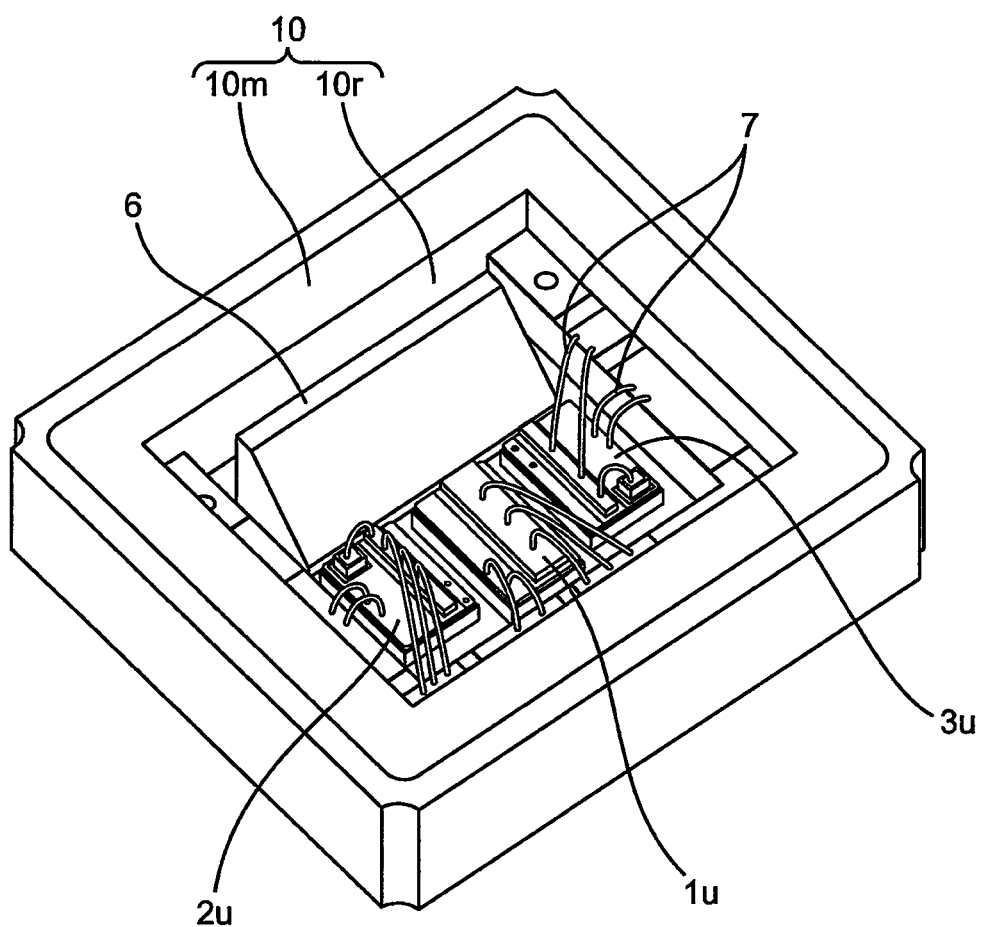
FIG. 2 is a perspective view schematically showing a step of wire bonding in the method of manufacturing a semiconductor device according to the first embodiment.

As shown in FIG. 2, in a wire bonding step, the wiring electrodes of the laser units 1u, 2u, 3u and the wiring electrodes in the recess 10r are connected to each other via wires 7.

3. Forming Solder Balls

Figure 3:
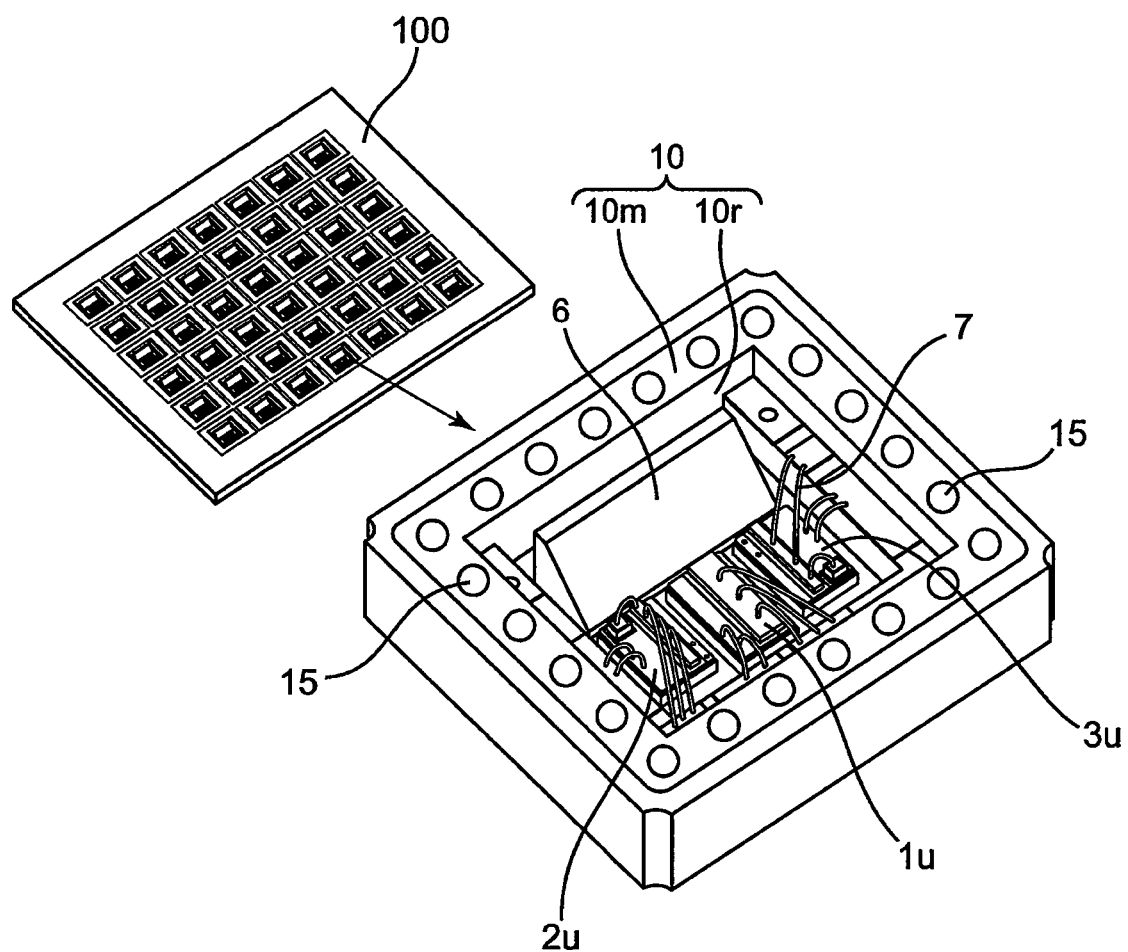
FIG. 3 is a perspective view schematically showing a step of forming a solder ball in the method of manufacturing a semiconductor device according to the first embodiment.
Figure 4:
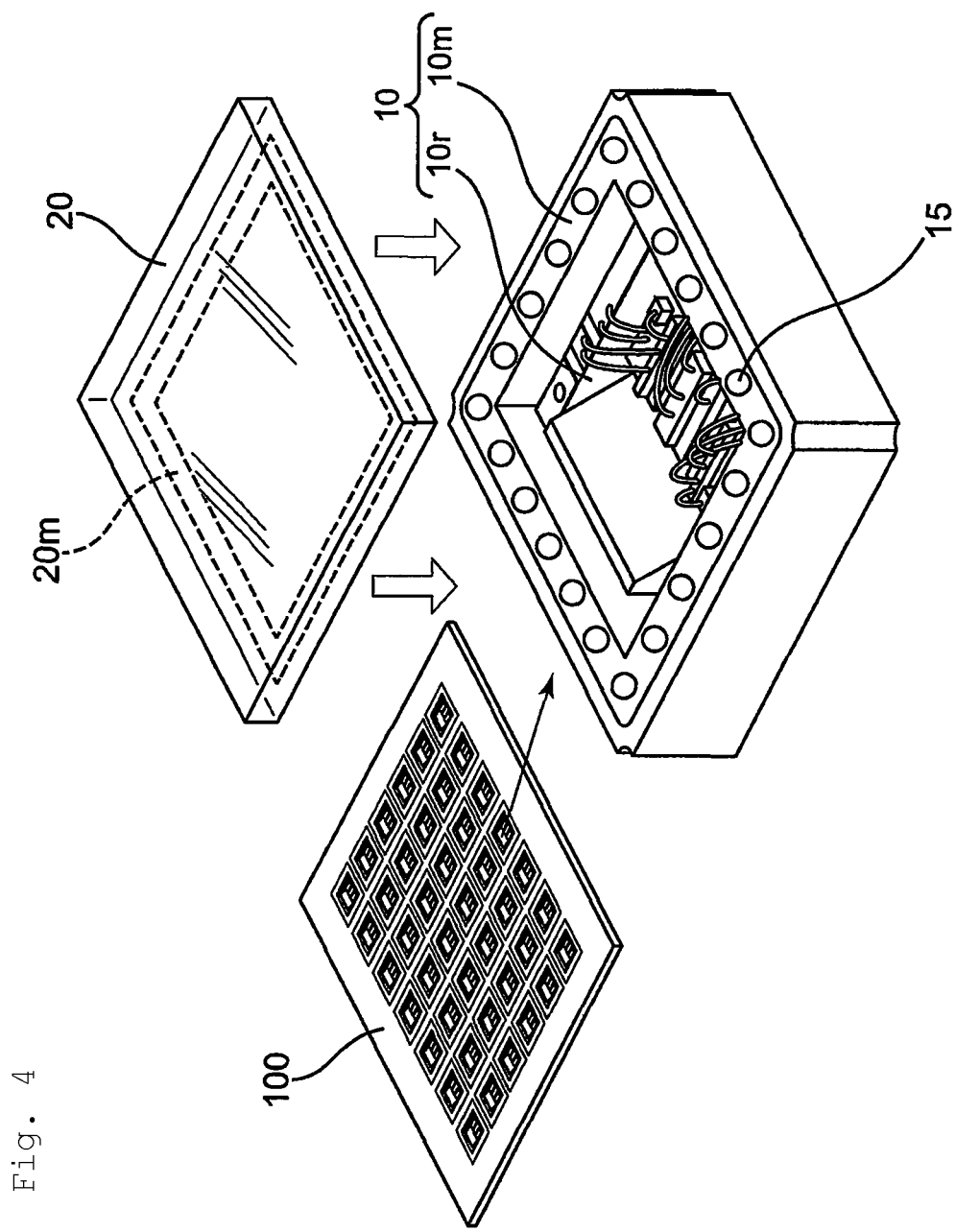
FIG. 4 is a perspective view schematically showing a step of pre-securing in the method of manufacturing a semiconductor device according to the first embodiment.

As shown in FIG. 3, in a solder ball forming step, a plurality of solder balls 15 formed of, for example, AuSn are arranged at certain intervals on the bonding metal film 10m at the upper surface of the package 10. For the solder balls 15, a solder such as AuSn is used. The solder balls 15 may have a diameter in a range of 80 μm to 400 μm, for example. The diameter of each solder ball 15 and the interval between adjacent ones of the solder balls 15 are selected as appropriate so that an appropriate air passage is obtained in a pre-securing step which will be described later, and hermetical sealing is ensured in a bonding step which will be described later. The diameter of each solder ball 15 preferably in a range of 100 μm to 200 μm. With each solder ball having a diameter of less than 100 μm, for example, when bonding a ceramic package having a bonding surface with a low flatness, the volume of such solder balls is not large enough to sufficiently fill up the irregularities of the bonding surface. With each solder ball having a diameter of 200 μm or more, the volume of the solder balls is excessively large, which may cause excessive spreading of solder balls in bonding. The interval between adjacent ones of the solder balls 15 is preferably in a range of 100 μm to 1000 μm. Such a range is selected according to the diameter of each solder ball. With the solder balls each having a diameter in the above-described range, the solder balls melted in the bonding step appropriately spread, so that effective bonding can be performed. Each solder ball 15 may have a spherical shape or any another appropriate shape, such as an ellipsoidal shape, a hemispherical shape, or an oval hemispherical shape. As used herein, "the diameter of each solder ball 15" refers to the maximum diameter of each solder ball 15. In the case in which the diameter of each solder ball 15 is not in the above-described range, a plurality of solder balls 15 may be formed overlapping one another at each of predetermined positions. In this manner, the solder balls 15 at each predetermined position may have a desired volume. Thus, an air passage can be appropriately obtained in the pre-securing step which will be described below, and hermetical sealing can be ensured in the step of bonding which will be described below. The shape and/or diameter of the overlapping solder balls 15 at each predetermined position may differ from those of each solder ball 15 when a single solder ball is provided at each predetermined position.

In the description above, the case in which, in the step of forming solder balls, a plurality of solder balls 15 are formed at certain intervals at the surface of the package 10 surrounding the recess 10r where the semiconductor laser elements are provided. The step of forming solder balls may be performed in any appropriate manner. For example, the structure may be turned upside down, such that a plurality of solder balls may be formed at certain intervals on the bonding metal film 20m disposed at the outer peripheral portion of the light-transmissive member 20. In this case, in the step of pre-securing, which will be described below, the bonding metal film 10m formed at the surface of the package 10 is brought into contact with the upper surface of softened solder balls 15, and thus is pre-secured thereto.

As described above, the plurality of solder balls 15 may be formed on a surface of the package 10, or on a surface of the light-transmissive member 20. In the first embodiment, the solder balls 15 are preferably formed at one of the package 10 and the light-transmissive member 20 having a higher thermal conductivity. With this manner, heat is easily transferred to the solder balls 15 in the pre-securing step and the bonding step, which will be described below. For example, in the case in which the package 10 is mainly formed of AlN ceramic, and the light-transmissive member 20 is mainly formed of sapphire, the solder balls 15 are formed on a surface of the package 10.

4. Bonding

A bonding step includes: (1) bringing a surface of the light-transmissive member 20 (i.e., a surface of the bonding metal film 20m provided at the lower surface of the light-transmissive member 20) into contact with an upper surface of the softened solder balls 15 such that an air passage communicating with the recess 10r between the solder balls 15 is formed, to perform pre-securing; and (2) reducing pressure in the recess 10r via the air passage formed between the solder balls 15, and, in the state in which a gas for sealing is injected after the reducing of the pressure, heating and pressing the light-transmissive member 20 and the package 10, to perform bonding. In the bonding step, the solder balls 15 are melted and the light-transmissive member 20 and the package 10 are bonded to each other.

As used herein, the expression "heating and pressing" does not limit the order of performing the heating and the pressing, and includes heating and thereafter pressing while heating; pressing and thereafter heating while pressing; and simultaneously heating and pressing.

The step of bonding will be more specifically described below.

(1) Pre-Securing

In the pre-securing, the light-transmissive member 20 is aligned such that the bonding metal film 20m formed along the outer periphery of the lower surface of the light-transmissive member 20 faces a plurality of solder balls 15, and the light-transmissive member 20 is pre-secured over the recess 10r. In the pre-securing, for example, the light-transmissive member 20 is pressed onto the solder balls 15 at a temperature lower than the melting point of the solder balls 15, so that the light-transmissive member 20 and the solder balls 15 can be easily bonded. In the bonding in the pre-securing, the package 10 and the light-transmissive member 20 are heated such that the heating temperature of the package 10 is preferably lower than the heating temperature of the light-transmissive member 20. This allows for reducing deterioration of the electrodes of the package 10 and the electrodes of the laser units 1u, 2u, 3u due to thermal damage, and allows for preventing increase in the drive voltage of the laser units. Furthermore, the temperature of the light-transmissive member 20, which has a thermal conductivity lower than a thermal conductivity of the package, can be increased in a short period. For example, when the solder balls 15 are formed of AnSn having melting point of 285° C., the heating temperature of the light-transmissive member 20 is set to be in a range of 230° C. to 270° C., and the heating temperature of the package 10 is set to be in a range of 180° C. to 220° C. The conditions in the thermal compression bonding to perform the pre-securing, such as heating temperature, pressure, time and the like are set as appropriate taking into consideration of the shape of each solder ball 15 and the interval of adjacent ones of the solder balls 15.

In the pre-securing, the solder balls 15 are heated at a temperature less than the melting point to be softened via the light-transmissive member 20, or via the light-transmissive member 20 and the package 10 as necessary, using a die bonder, for example. Then, the light-transmissive member 20 is brought into contact with the upper surface of the softened solder balls 15 to be pre-secured, so as to form an air passage communicating with the recess 10r between the solder balls 15. The pre-securing is performed such that adjacent ones of the solder balls are not in contact with each other when the solder balls are softened. This allows for securing an air passage communicating with the recess 10r. The pre-securing can be performed in the atmosphere. Unlike the bonding described below, it is not necessary for the pre-securing to be performed in a vacuum chamber. As compared to the case in which the pre-securing is performed in a vacuum chamber, or the case in which the bonding is performed in a vacuum chamber without the pre-securing, performing the pre-securing outside a vacuum chamber allows for bonding in high alignment accuracy. Furthermore, performing the pre-securing outside vacuum allows for reducing misalignment between the light-transmissive member 20 and the package 10 when the package 10 is transferred.

(2) Bonding

In the bonding, the package 10 to which the light-transmissive member 20 is pre-secured (the collective substrate 100) is transferred into a vacuum chamber. Next, by reducing the pressure inside the vacuum chamber, the pressure in the recess 10r covered with the light-transmissive member 20 is reduced via the air passage formed between the solder balls 15. After the pressure in the recess 10r is reduced, by introducing a gas for sealing into the vacuum chamber, the gas for sealing is injected into the recess 10r. In the state in which the gas for sealing is injected into the recess 10r, the light-transmissive member 20 and the package 10 are heated and pressed.

This heating and pressing are performed using, for example, a hot press disposed in a vacuum chamber in which decompression can be performed. The hot press includes an upper mold (i.e., a first pressing element) and a lower mold (i.e., a second pressing element) in each of which heating temperature can be adjusted. The heating and pressing are performed in the manner as described below.

Figure 5:
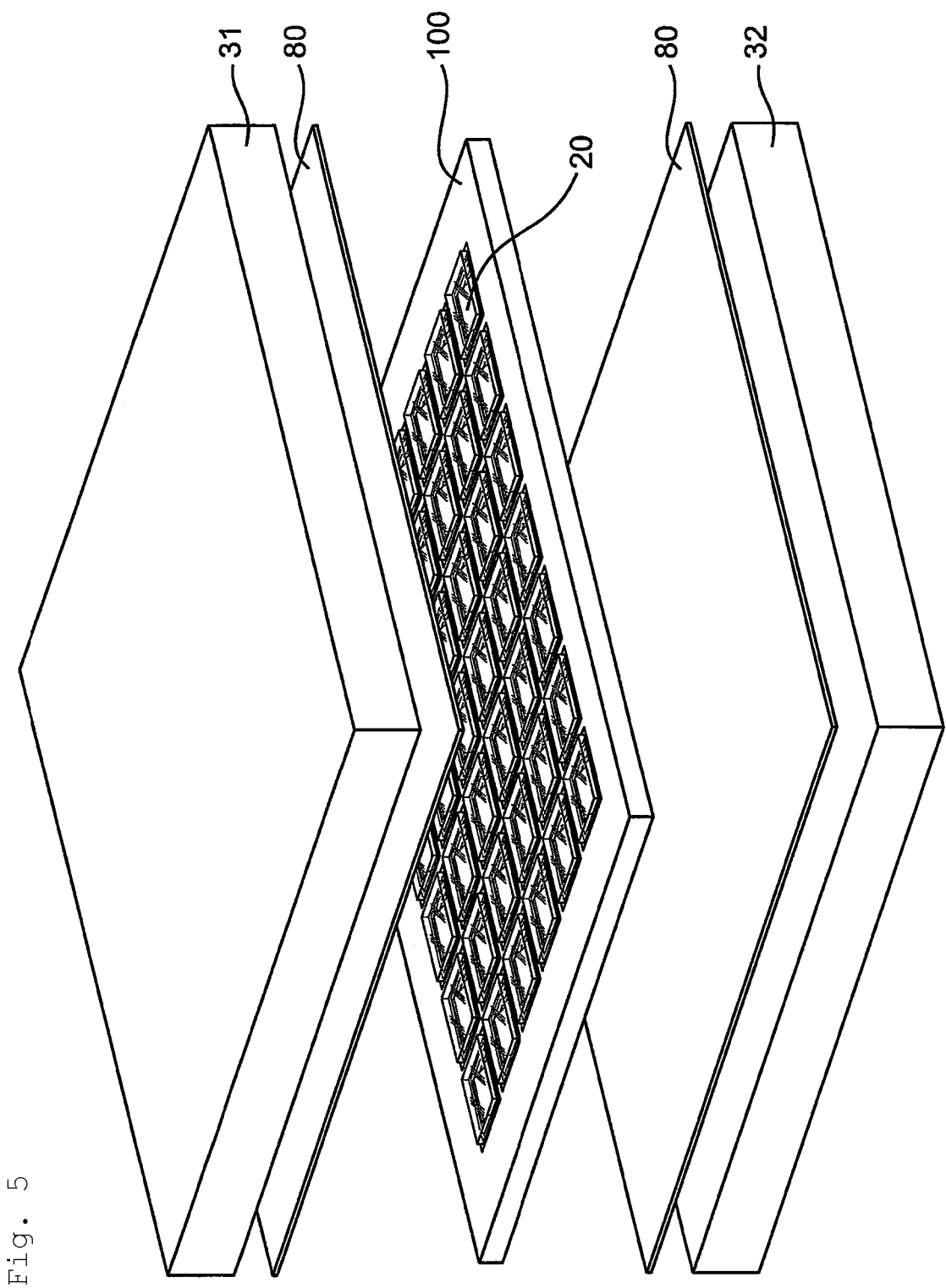
FIG. 5 is a perspective view schematically showing a step of bonding in the method of manufacturing a semiconductor device according to the first embodiment.

As schematically shown in FIG. 5, between an upper mold 31 and a lower mold 32 in the vacuum chamber, the collective substrate 100 having the light-transmissive member 20 mounted on each recess 10r is disposed.

Next, the upper mold 31 and the lower mold 32 are brought into contact with the collective substrate 100 such that the air passage formed between the solder balls 15 are not blocked. In this state, the pressure in the vacuum chamber is reduced. After the pressure is reduced, the gas for sealing is supplied into the vacuum chamber. Thus, the gas for sealing is injected into the recess 10r covered with the light-transmissive member 20 via the air passage between the solder balls 15. Examples of the gas for sealing include a gas mixture containing dry air and helium gas. When using the gas mixture containing dry air and helium gas, the proportion of oxygen and nitrogen, which is contained in the dry air, and helium gas is, for example, oxygen 20%, nitrogen 60%, and helium 20%.

Next, in the state in which the gas for sealing is injected, the light-transmissive member 20 and the package 10 are heated and pressed with the upper mold 31 and the lower mold 32.

The upper mold 31 and the lower mold 32 are heated such that, for example, the solder balls 15 has a temperature equal to or higher than the melting point. In the heating, the heating temperature of the package 10 is preferably lower than the heating temperature of the light-transmissive member 20 by, for example, setting the temperature of the lower mold 32 to be lower than that of the upper mold 31. That is, it is preferable that the upper mold 31 (i.e., the first pressing element) heated at a first temperature is brought into contact with and pressed against the light-transmissive member 20 and the lower mold 32 (i.e., the second pressing element) heated at a second temperature lower than the first temperature is brought into contact with and pressed against the package 10, melting the solder balls 15 to bond the light-transmissive member 20 and the package 10. This allows for reducing deterioration of the electrodes of the package 10 and the laser units 1u, 2u, 3u due to thermal damage, and allows for preventing increase in the drive voltage of the laser units.

For example, the heating and pressing the package 10 at a temperature lower than the melting point of the bonding member used when mounting the semiconductor laser element in the recess 10r allows for preventing shift of the mounting position of the semiconductor laser element from a predetermined position.

Furthermore, in the case in which the semiconductor laser elements are mounted on the submounts 4a, 4b via the first bonding member and the submounts 4a, 4b are mounted in the recess 10r via the second bonding member, for example, the package 10 is heated and pressed at a temperature lower than the melting point of the first bonding member and the melting point of the second bonding member. This allows for preventing shift of the mounting position of the semiconductor laser element from a predetermined position. In the bonding as described above, for example, the temperature of the upper mold 31 (the first pressing element) is preferably in a range of 280° C. to 400° C., and the temperature of the lower mold 32 (the second pressing element) is preferably in a range of 100° C. to 200° C. Furthermore, the load applied by the pressing is preferably in a range of 10 N to 100 N per 1 cm$^2$.

In the step of bonding as described above, it is preferable that a buffer sheet, which has resistance to the heating temperature and is flexible, is disposed between the upper mold 31 (i.e., the first pressing element) and the light-transmissive member 20, and the light-transmissive member 20 is heated and pressed via the buffer sheet 80. In this manner, the light-transmissive members 20 can be evenly pressed, and hermetic sealing of each of the light-transmissive members 20 can be surely performed. Hermetic sealing of the light-transmissive member 20 can be confirmed by, for example, the leakage amount of dry air. When the leakage amount of dry air is $10^{-8}$ Pa·m$^3$/s or less, it can be regarded that the light-transmissive member 20 is sufficiently sealed hermetically. Furthermore, using the buffer sheet allows for reducing the thermal contact resistance between the upper mold 31 (i.e., the first pressing element) and the light-transmissive member 20, that is, allows for improving the thermal conductivity. This allows for efficiently heating the light-transmissive member 20.

Examples of the buffer sheet include a carbon sheet. The carbon sheet has high heat resistance, and has flexibility and compression resilience in a wide temperature range, and thus is suitable. Furthermore, as compared to other flexible member such as rubber, the carbon sheet does not emit a gas that would contaminate the gas for sealing, and thus is suitable.

In the step of bonding as described above, in place of or in addition to the buffer sheet disposed between the upper mold 31 (i.e., the first pressing element) and the light-transmissive member 20, a buffer sheet having resistance to the heating temperature and being flexible may be disposed between the lower mold 32 (i.e., the second pressing element) and the package 10.

When the buffer sheet is disposed between the lower mold 32 (i.e., the second pressing element) and the package 10, the state of contact at the bottom surface side of the package 10 can be improved, so that heat can be efficiently dissipated. Thus, for example, with the heating temperature of the lower mold 32 lower than the heating temperature of the upper mold 31, heat at the upper mold 31 side can be efficiently dissipated toward the lower mold, which can prevent an increase in the temperature of the package 10. For the buffer sheet at the lower mold 32 side, a carbon sheet can be used, as in the buffer sheet at the upper mold 31 side.

5. Singulating

Figure 6:
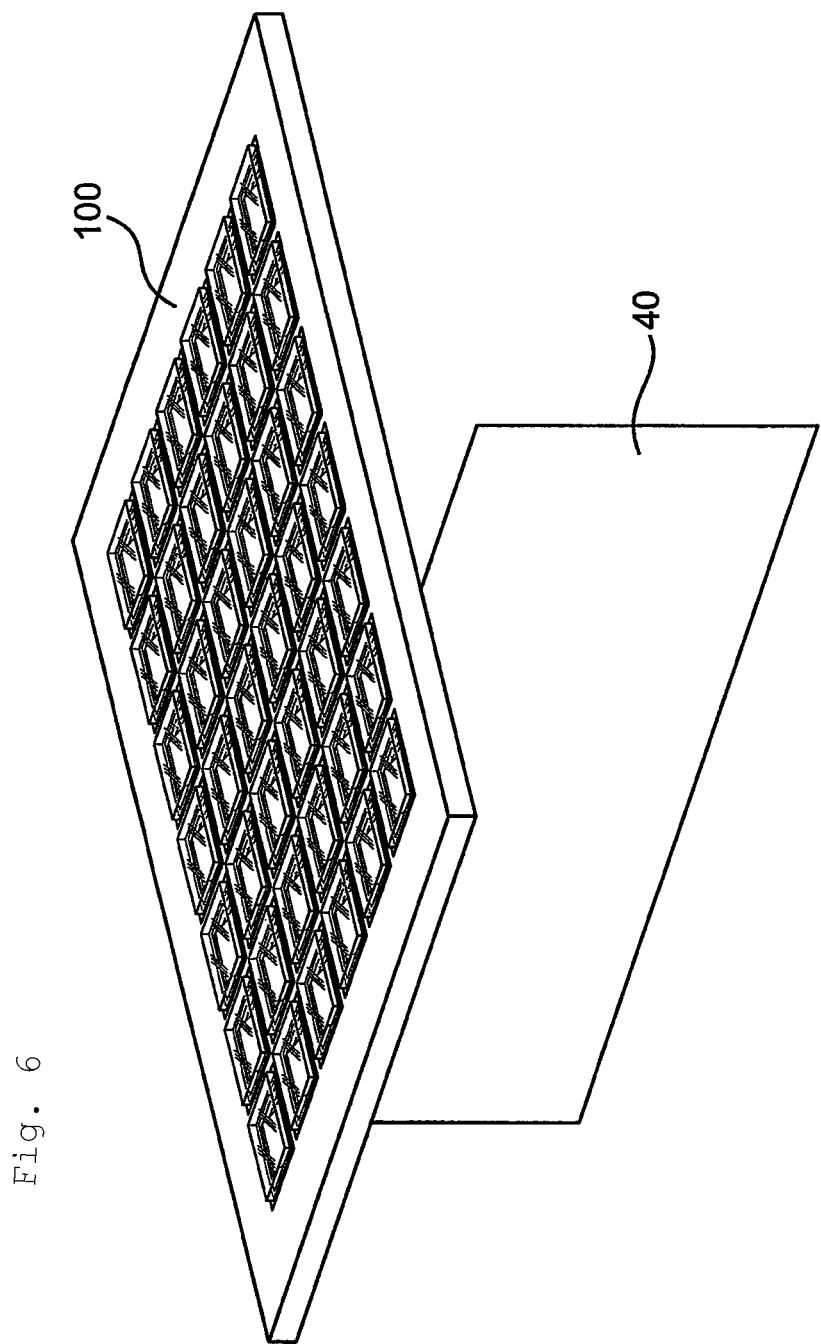
FIG. 6 is a perspective view schematically showing a step of singulating in the method of manufacturing a semiconductor device according to the first embodiment.
Figure 7:
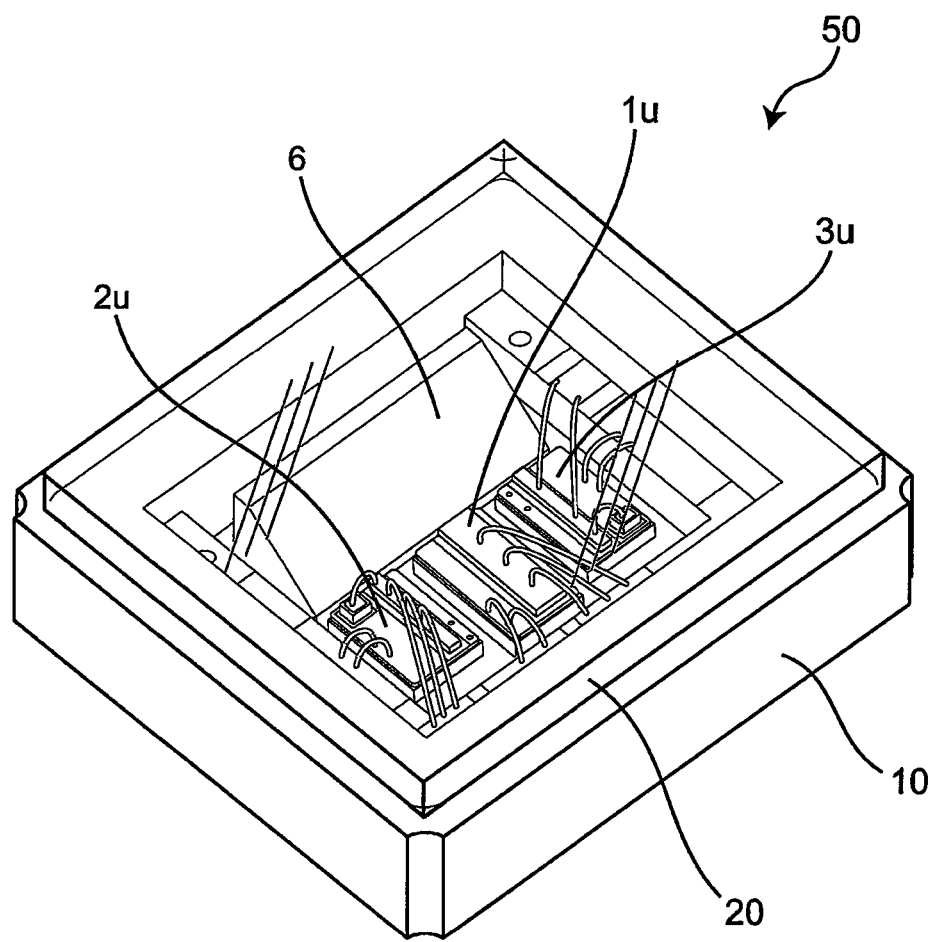
FIG. 7 is a perspective view schematically showing a light emitting device singulated in the method of manufacturing a semiconductor device according to the first embodiment.

The light emitting devices that are collectively manufactured through the steps described above are divided into individual light emitting devices using, for example, a breaking blade 40 as shown in FIG. 6. As described above, the collective substrate is provided with slits for singulating. Therefore, the collective substrate is singulated by pressing the breaking blade 40 against each slit. In this singulating step, the breaking blade 40 is pressed against the collective substrate from the package side. This allows for preventing damage to the light-transmissive member as compared to the case in which the breaking blade 40 is pressed against the collective substrate from the light-transmissive member 20 side. FIG. 7 shows a singulated light emitting device.

Thus, the light emitting device 50 in which the semiconductor laser element disposed in the recess 10r is sealed hermetically by the light-transmissive member 20 is manufactured.

According to the method of manufacturing a semiconductor device of the first embodiment configured as described above, the pre-securing is performed before the bonding. This allows for performing the pre-securing outside a vacuum chamber. Thus, the light-transmissive member and the package can be bonded with high alignment accuracy. If the pre-securing is not performed and the light-transmissive member and the package are aligned with each other inside a vacuum chamber, the inside of the vacuum chamber is observed through an observation window of the vacuum chamber. Accordingly, an observed area is limited, so that accurate positions of the light-transmissive member and the package may not be easily detected. Meanwhile, the light-transmissive member can be disposed easily using a general die bonder or the like.

In the method of manufacturing a semiconductor device according to the first embodiment, in the bonding step, by reducing the pressure in the vacuum chamber, the pressure inside the recess 10r covered with the light-transmissive member 20 is reduced via the air passage formed between the solder balls 15. After reducing the pressure, the gas for sealing is injected. Thus, using the reducing of the pressure, moisture or gas component attached to the package 10 can be removed. Accordingly, in contrast to the case in which the pre-securing is not performed, in the present embodiment, heating at a temperature of, for example, 200° C. for long time to remove moisture or any gas component is not necessary. That is, the present embodiment allows for reducing deterioration of the semiconductor laser element due to heating for long time.

Furthermore, in the method of manufacturing a semiconductor device according to the first embodiment, hermetic sealing of a plurality of semiconductor devices can be performed collectively using the collective substrate 100, so that manufacturing can be performed at a low cost compared to the case of manufacturing a light emitting device with a CAN package.

In the first embodiment described above, an example of manufacturing a light emitting device is described, so as to describe the method of manufacturing a semiconductor device. The method of manufacturing a semiconductor device according to the first embodiment is not limited to the method of manufacturing a light emitting device, and is applicable also to a method of manufacturing another semiconductor device that requires hermetic sealing. Also, when the first embodiment is applied to a method of manufacturing another semiconductor device, as in the method of manufacturing a semiconductor device according to the first embodiment, the light-transmissive member and the package can be bonded to each other with high alignment accuracy, and the semiconductor device can be manufactured at a low cost.

The semiconductor device described in the first embodiment may include another member such as a wiring board, a collimating lens and the like. In a light emitting device 50, for example, a collimating lens may be disposed on the light-transmissive member 20, allowing light beams emitted from the semiconductor laser elements to be collimated and then emitted.

For example, for manufacturing of the light emitting device including a collimating lens, the light emitting device 50 obtained using the method of manufacturing according to the first embodiment can be used, and the steps described below can be additionally performed.

6. Mounting on Wiring Board

Figure 8:
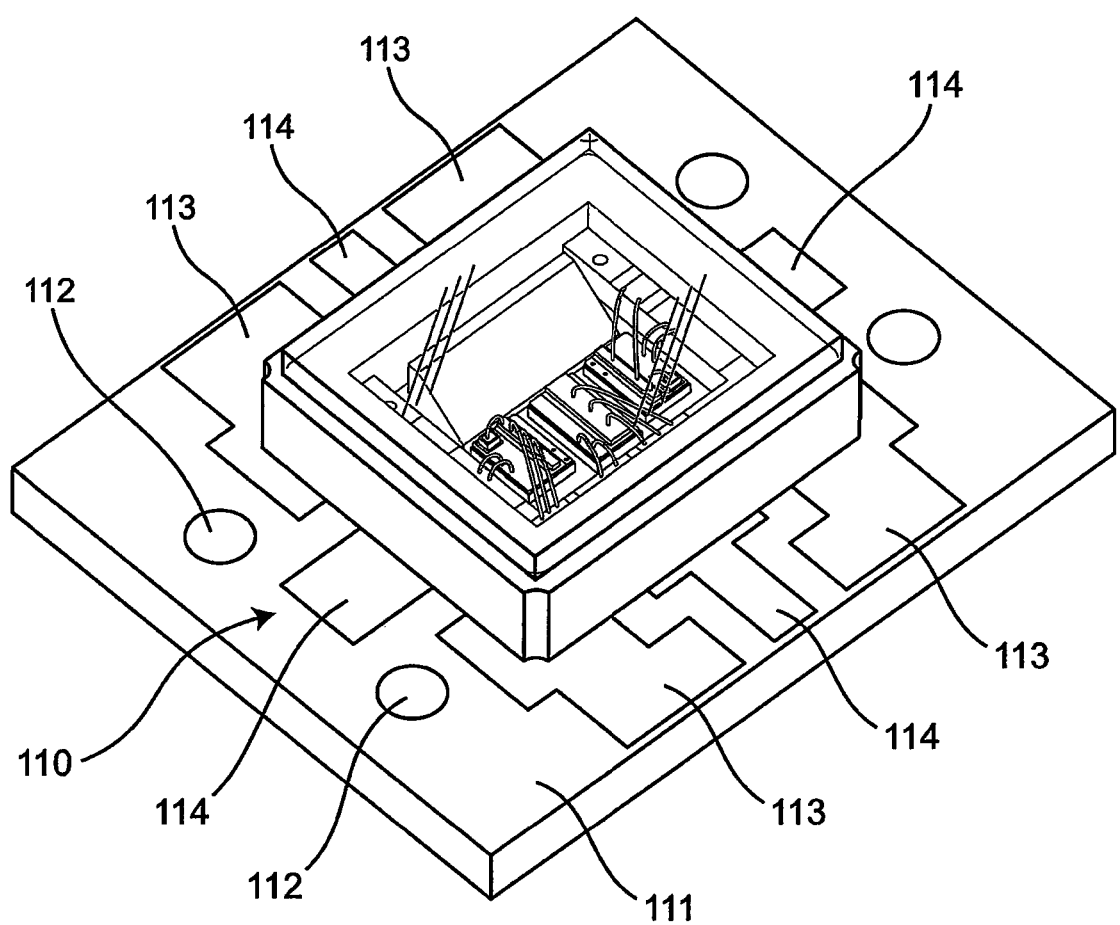
FIG. 8 is a perspective view schematically showing a wiring board mounting operation in the method of manufacturing a semiconductor device according to the first embodiment.

As shown in FIG. 8, the package 10 of the light emitting device 50 manufactured through the method of manufacturing according to the first embodiment is mounted on a wiring board 110. As shown in FIG. 8, the wiring board 110 is formed of, for example, ceramic, and includes: a substrate 111 provided with a metal film 112 which functions as an alignment mark when mounting the package 10 on the wiring board 110; a wiring electrode 113 for electrically connecting with the light emitting device 50; and a metal film 114 for securing the heat dissipation surface of the package 10 and the substrate 111 to each other. The substrate 111 is preferably formed of a material identical to a material of the package 10. For example, when the package 10 is formed of a ceramic, the substrate 111 is formed of a ceramic material identical to the ceramic material of the package 10.

7. Mounting Collimating Lens

Figure 9:
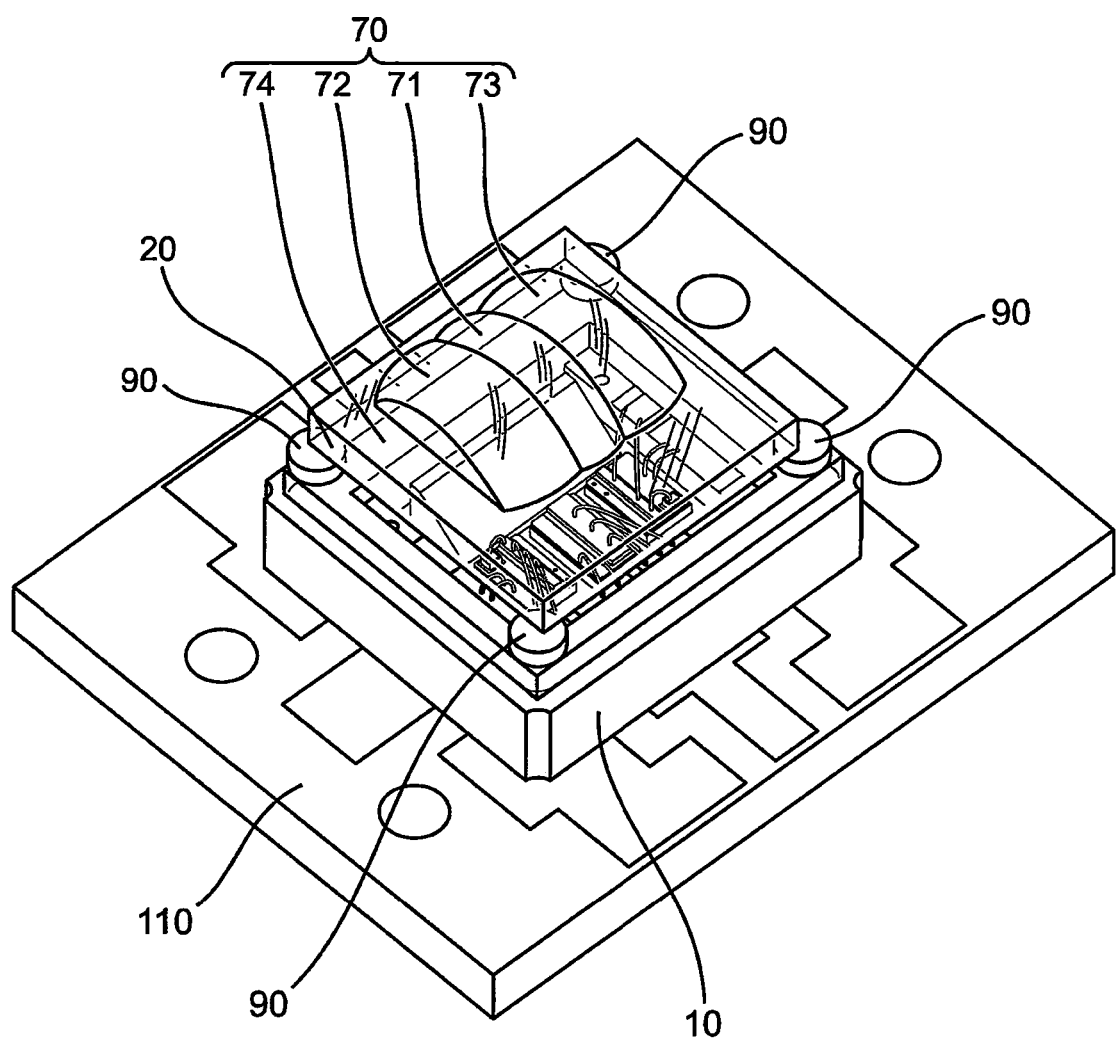
FIG. 9 is a perspective view schematically showing a step of mounting a collimating lens in the method of manufacturing a semiconductor device according to the first embodiment.

Next, as shown in FIG. 9, a collimating lens 70 is mounted on the light-transmissive member 20. An adhesive agent 90 is applied onto the four corners of the upper surface of the light-transmissive member 20, and the collimating lens 70 is aligned and is secured thereon. The collimating lens 70 may be formed of glass, such as borosilicate glass. In the collimating lens 70, a first lens part 71 emitting laser light from the semiconductor laser element 1 in a predetermined direction, a second lens part 72 emitting laser light from the semiconductor laser element 2 in a predetermined direction, and a third lens part 73 emitting laser light from the semiconductor laser element 3 in a predetermined direction, are arranged. In the collimating lens 70, a non-lens part 74 surrounds the first lens part 71, the second lens part 72, and the third lens part 73.

In the light emitting device including a collimating lens manufactured in the manner as described above, light beams emitted from the semiconductor laser elements can be collimated and then emitted.

The method of manufacturing a semiconductor device is not limited to the method described above. When the hermetic sealing is performed without vacuuming, the method described below may be employed, for example.

Second Embodiment

A method of manufacturing a semiconductor device according to a second embodiment includes sealing a semiconductor laser element provided in a recess of a package by covering the recess with a light-transmissive member, forming solder balls, and bonding. In the step of forming the solder balls, a plurality of solder balls are formed at intervals on a surface of the package surrounding the recess where the semiconductor laser element is disposed, or on a surface of the light-transmissive member facing the surface of the package. In the step of bonding, in a state in which the package and the light-transmissive member are separated from each other or integrated with each other having an air passage formed between the solder balls, the package and the light-transmissive member are housed in a container including a supply port for supplying a gas for sealing and an exhaust port for exhausting the gas for sealing; and, while the gas for sealing is supplied to the container, the package or the light-transmissive member provided with the solder balls are heated and the package and/or the light-transmissive member are pressed, so as to melt the solder balls and bond the surface of the light-transmissive member and the surface of the package.

In the method of manufacturing a semiconductor device according to the second embodiment, a vacuum chamber is not used. Therefore, the second embodiment allows for providing a semiconductor device in which the light-transmissive member and the package are bonded with high alignment accuracy.

The method of manufacturing a semiconductor device according to the second embodiment will be described in detail below. Descriptions substantially identical to those in the first embodiment may be omitted as appropriate.

(1) Providing Package

Figure 10:
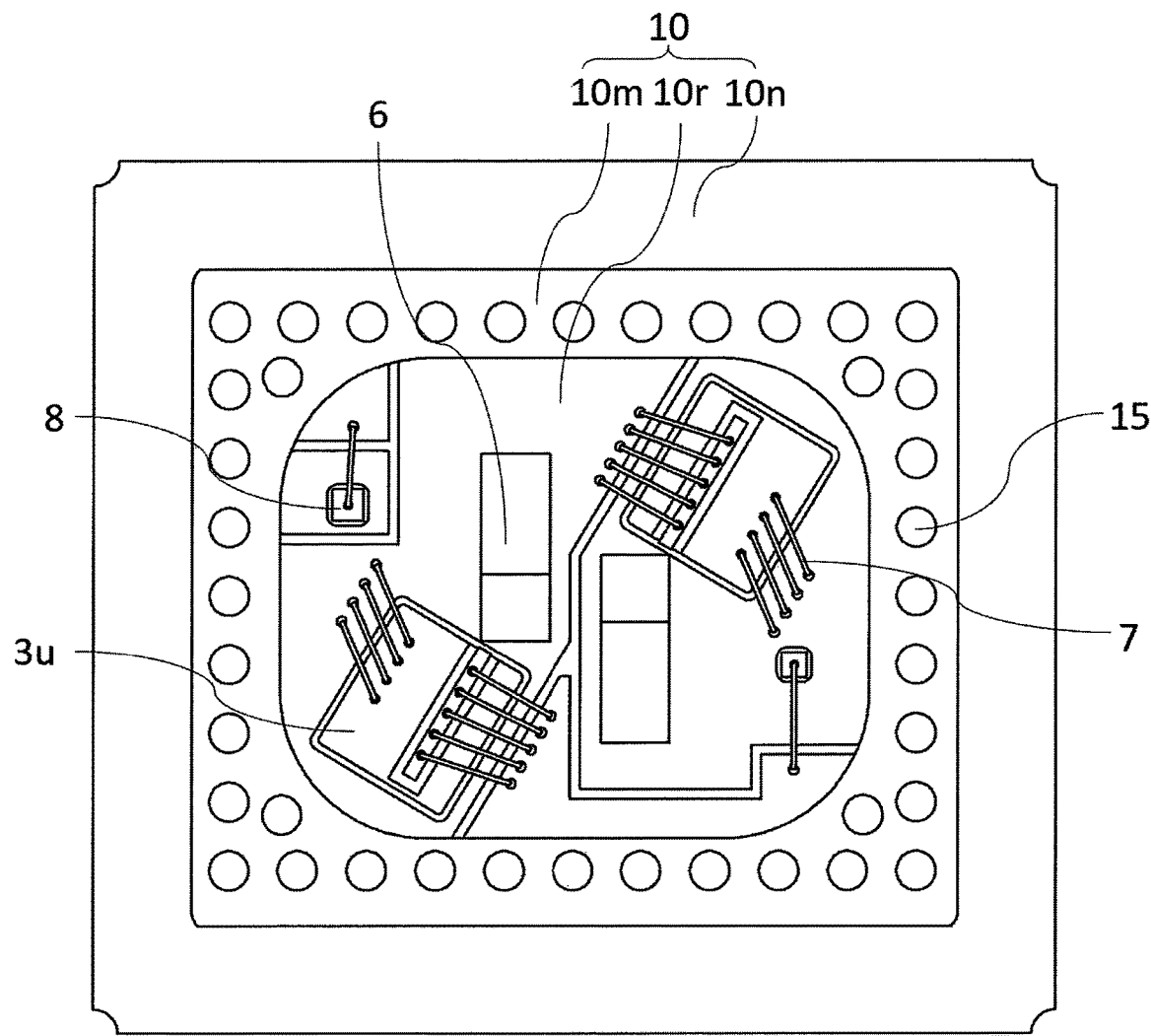
FIG. 10 is a schematic top view of a package of a semiconductor device according to a second embodiment.

With reference to FIG. 10, a description will be given of the package 10.

In relation to providing the package, configurations not described below are substantially identical to those in the first embodiment.

The package 10 is provided. The package 10 that has been singulated may be used, or a collective substrate 100 in which a plurality of packages 10 are collectively arranged may be used.

The package 10 includes an outer peripheral part 10*n* for disposing the light-transmissive member 20, a surface where the light-transmissive member 20 is bonded, and the recess 10*r* where the semiconductor laser units are disposed. The surface of the outer peripheral part 10*n* is located higher than the surface where the light-transmissive member 20 is bonded. The surface where the light-transmissive member 20 is bonded has a shape with corners. Of the corners of the surface of the package surrounding the recess 10*r* and to which the light-transmissive member 20 is bonded, the radius of curvature of the corners at the recess 10*r* side is greater than the radius of curvature of the corners at the outer peripheral part 10*n* side.

When the package 10 and the light-transmissive member 20 are formed of different materials, a coefficient of linear expansion of the package 10 may not be the same as a coefficient of linear expansion of the light-transmissive member 20. In such a case, the bonding member bonding the package 10 and the light-transmissive member 20 to each other may experience thermal stress attributed to the difference in coefficient of linear expansion between the package 10 and the light-transmissive member 20, and be damaged.

In the second embodiment, as shown in FIG. 10, of the corners of the package surface surrounding the recess 10r and bonded to the light-transmissive member 20, the radius of curvature of the corners at the recess 10r side is preferably greater than the radius of curvature of the corners at the outer peripheral part 10n side. With such curvatures of the recess, possibility of causing damage to the bonding member bonding the package 10 and the light-transmissive member 20 due to the thermal stress can be reduced. When reducing the entire size of the package, it is preferable that the shape of the corners on the outer peripheral part corresponds to the shape of the light-transmissive member 20. When using a material that would complicate the operation of providing curvatures to the corners of the light-transmissive member 20, it may be difficult to sufficiently increase the radius of curvature at the outer peripheral part side, but a radius of curvature of the corners on the recess side as described above allows for reducing concentration of the thermal stress. Examples of such a light-transmissive member 20 include sapphire.

Furthermore, the package shape described above allows a greater number of solder balls to be arranged at the corners than in other regions. Increase in the number of the solder balls 15 allows for enhancing adhesion between the package 10 and the light-transmissive member 20, so that leakage of the gas for sealing does not easily occur.

(2) Providing Semiconductor Laser Element

For the semiconductor laser elements to be provided, a semiconductor laser element using a material and having a peak emission wavelength similar to those in the first embodiment. The semiconductor laser elements are not limited to the red, green, and blue (RGB) semiconductor laser elements. The semiconductor laser elements may emit light with one or two colors of RGB. A plurality of semiconductor laser elements emitting light of a single color may be provided. In the second embodiment, a description will be given of the case in which a semiconductor laser element emitting blue light is used.

(3) Mounting Semiconductor Laser Element on Submount and (4) Providing Light-Reflecting Member While the number and emission color of the mounted semiconductor laser element may be changed as appropriate in forming the laser unit, these steps are substantially identical to those described in the first embodiment.

(5) Providing Light-Transmissive Member

Figure 11A:
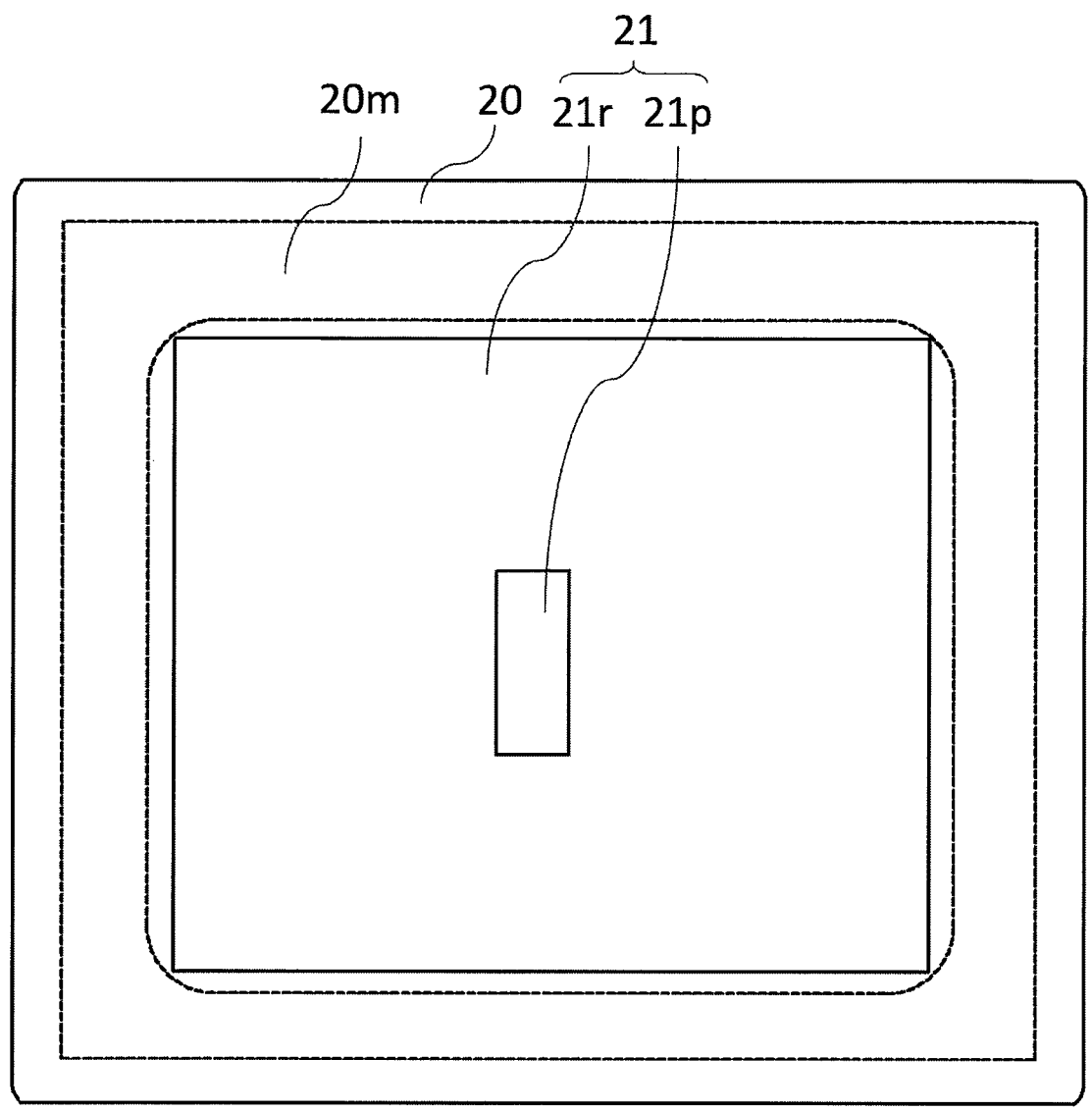
FIG. 11A is a schematic top view of a light-transmissive member and a wavelength conversion member according to the second embodiment.

With reference to FIG. 11A, a description will be given of the light-transmissive member 20.

The providing of the light-transmissive member is substantially identical to that in the first embodiment except for the matters described below.

In the case in which the blue-light emitting semiconductor laser element 3 is used, as shown in FIG. 11A, the light-transmissive member 20 may further include a wavelength conversion member 21 so that the semiconductor device emits white light. The wavelength conversion member 21 is excited by laser light emitted by the semiconductor laser element 3, and emits light with a wavelength different from the laser light. Examples of the wavelength conversion member include a monocrystalline or polycrystalline fluorescent material, a complex of a fluorescent material and a reflecting material, and a sintered body obtained by molding and sintering a powder of a fluorescent material and a reflecting material. For a fluorescent material 21p, a so-called YAG fluorescent material, in which yttrium-aluminum-garnet (hereinafter referred to as YAG) is a base material, activated by cerium can be used. Examples of the reflecting member 21r include aluminum oxide, aluminum nitride, YAG not containing an activator, and yttrium oxide.

In the method of manufacturing a semiconductor device according to the second embodiment, on the provided package 10, the provided laser unit 3u, light-reflecting member 6, light-transmissive member 20 and the like are mounted through the steps described below, to obtain a light emitting device.

1. Mounting, 2. Wire-bonding, and 3. Forming Solder Ball

The mounting step, the wire bonding step, and the solder ball forming step are substantially similar to those in the first embodiment. The solder balls 15 may be provided on a surface of the package 10 surrounding the recess or on a surface of the light-transmissive member 20 facing the surface of the package surrounding the recess. In the second embodiment, a description will be given of the case in which the solder balls 15 are provided on the surface surrounding the recess of the package 10.

4. Bonding

In the bonding step according to the second embodiment, a surface of the light-transmissive member and a surface of the package are bonded to each other with the melted solder balls. In the bonding step, in the state in which the package and the light-transmissive member are separated from each other or integrated with each other having an air passage formed between the solder balls, the package and the light-transmissive member are housed in a container including a supply port for supplying the gas for sealing and an exhaust port for exhausting the gas for sealing; and while the gas for sealing is supplied to the container, the package or the light-transmissive member provided with the solder balls are heated, and the package and/or the light-transmissive member are pressed.

As used herein, the expression "housed in the state in which the package and the light-transmissive member are separated from each other" includes the case in which the package and the light-transmissive member are housed simultaneously, and the case in which the package and the light-transmissive member are housed at different times. In the case in which the package and the light-transmissive member are housed at different times, the package may be housed earlier, or the light-transmissive member may be housed earlier.

Further, the heating of the package or the light-transmissive member provided with the solder balls may be performed earlier, or the pressing of the package and/or the light-transmissive member may be performed earlier.

Figure 12A:
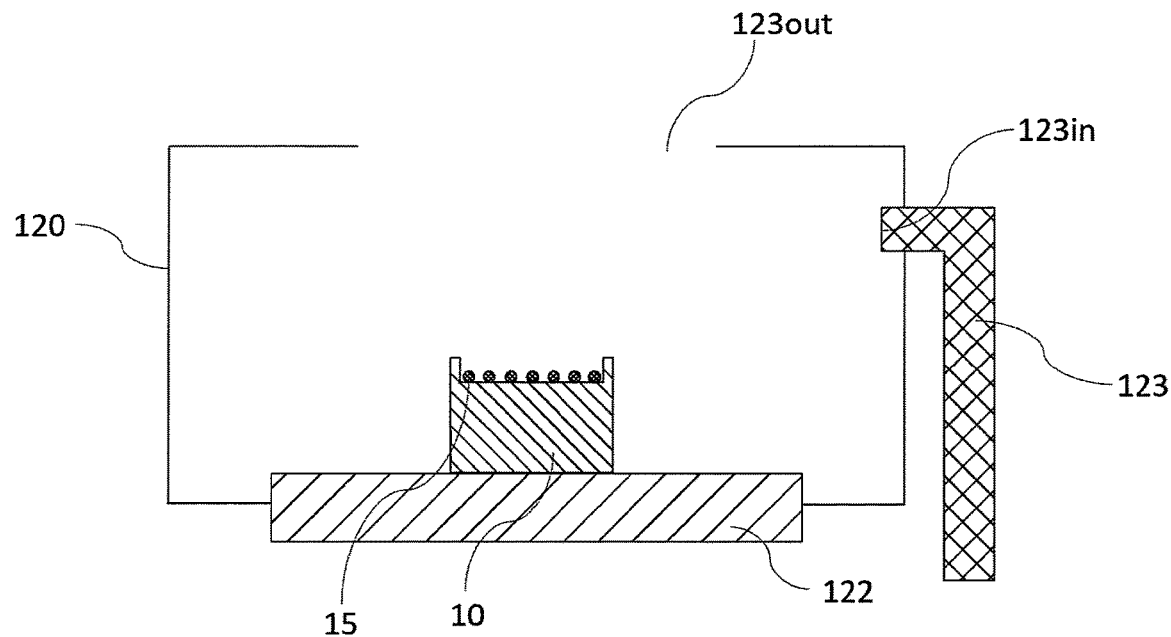
FIG. 12A is a cross-sectional view schematically showing a step of bonding in a method of manufacturing a semiconductor device according to the second embodiment.
Figure 12B:
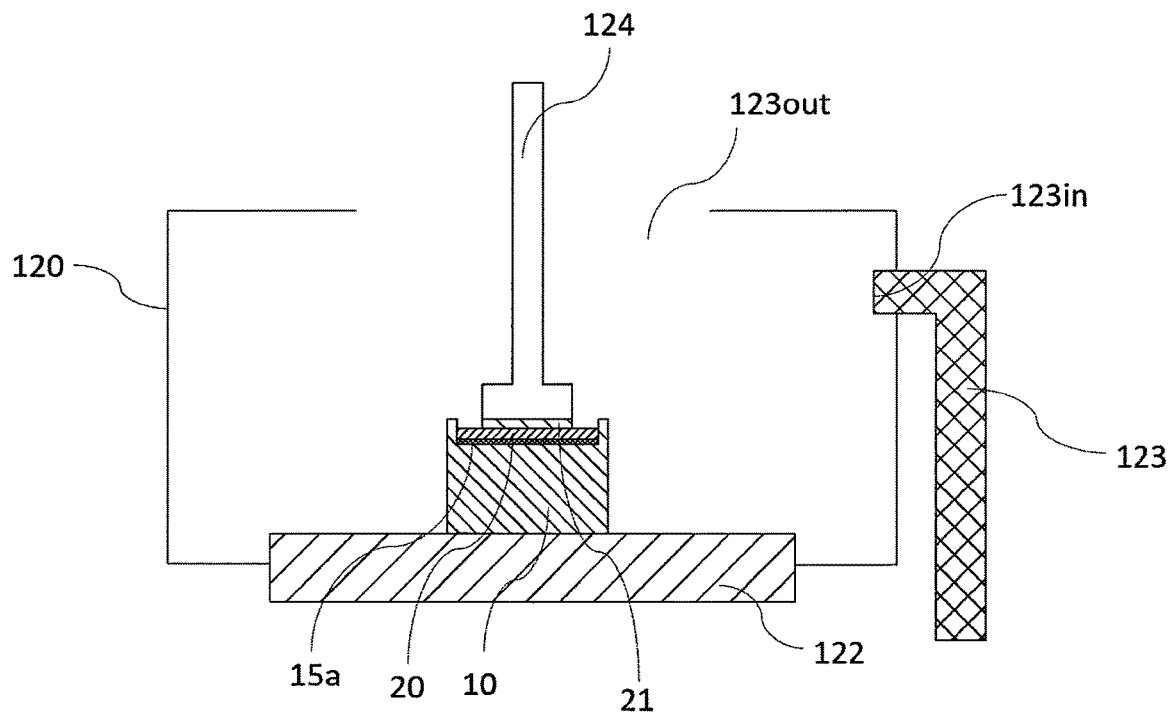
FIG. 12B is a cross-sectional view schematically showing the step of bonding in the method of manufacturing a semiconductor device according to the second embodiment.

With reference to FIGS. 12A and 12B, the bonding step will be described below.

A container including at least a supply port 123in and an exhaust port 123out is disposed on a stage 122 provided with a heater. The container 120 and the stage 122 may be integrally formed. In this case of integrally forming the container 120 and the stage 122, the container 120 and the stage 122 may be regarded as one container as a whole.

The gas for sealing is supplied via a gas line 123, and introduced via the supply port 123in into the container 120. Through the exhaust port 123out of the container 120, the gas for sealing is exhausted to the outside of the container. At this time, the gas having filled the container and containing moisture is also exhausted. Thus, with the container 120 being filled with dry air, that is, with the recess 10r of the package 10 being filled with dry air, the package is sealed hermetically with the light-transmissive member. Accordingly, the dew point of the semiconductor device is lower than that in the case in which the package is sealed containing gas containing moisture.

The gas for sealing is preferably being supplied continuously before the package 10 is introduced into the container 120 until the end of the bonding. This allows for surely substituting the gas for sealing for the atmosphere in the container 120.

The flow rate of the gas for sealing is preferably at least 5 liters per minute. Thus, the gas in the container 120 can be sufficiently substituted for, and the dew point of the semiconductor device becomes lower. The upper limit temperature of the gas for sealing may be less than the melting point of the solder balls 15. For example, when the solder balls 15 are formed of AuSn, the temperature of the gas for sealing is 280° C. or less.

Similarly to the first embodiment, the gas for sealing may be a gas mixture including dry air and helium gas.

It is preferable that the temperature of the stage 122 is lower than the melting point of the solder balls 15, and is the stage 122 is heated to a point near the melting point of the solder balls 15. The stage 122 is heated such that the difference between a temperature of the stage 122 and the melting point of the solder balls 15 is, for example, 30° C. or less, preferably 20° C. or less, and further preferably 10° C. or less. By heating the stage 122 before providing the package, when the package 10 provided with the solder balls 15 is disposed on the stage 122, the temperature of the package 10 attains a temperature equal to or higher than the melting point of the solder balls 15 quickly than in the case in which the package 10 is disposed and then heated. This allows for reducing the lead time.

Next, the package 10 provided with the solder balls 15 and the light-transmissive member 20 are housed in the container 120. As shown in FIG. 12B, by applying pressure to the light-transmissive member 20 using a pressing element 124, a surface of the package 10 and a surface of the light-transmissive member 20 are bonded to each other via the solder balls 15. The package 10 and the light-transmissive member 20 may be housed before or after the gas for sealing is supplied into the container 120. The light-transmissive member 20 may be introduced into the container 120 in a state of being attached to the pressing element 124, and then bonded to the package 10. The load that the pressing element 124 applies is preferably in a range of 1 N to 200 N. The load is more preferably in a range of 1 N to 100 N. With the container filled with the gas for sealing, merely placing the light-transmissive member 20 on the package 10 may not cause sufficient spreading of the solder balls 15, but applying the load in the above-described range allows the solder balls 15 to spread in an area sufficient for the bonding.

For describing the bonding step described above, the description has been given of an example in which a plurality of solder balls 15 is formed at intervals on a surface of the package surrounding the recess 10r and to which the light-transmissive member 20 is bonded. The step of bonding may be performed in any appropriate manner, and for example, a plurality of solder balls may be formed at intervals on the bonding metal film 20m provided at an outer peripheral portion of the light-transmissive member 20. In this case, the light-transmissive member 20 is disposed on the stage 122, the package 10 is pressed using the pressing element 124, to perform bonding.

5. Singulating

Singulating step is performed in the case in which the collective substrate 100 is provided in the providing of the package. For example, the singulating is performed as in the first embodiment. In the case in which the singulating is already performed before the bonding, the singulating may not be performed.

In the method of manufacturing a semiconductor device according to the second embodiment as described above, a vacuum chamber is not used, so that the light-transmissive member and the package are bonded with high alignment accuracy.

Furthermore, in the method of manufacturing a semiconductor device according to the second embodiment, by substituting the gas for sealing for the gas in the container, even without vacuuming, the light emitting device and the light-transmissive member are sealed hermetically with a reduced amount of moisture in the semiconductor device.

Figure 11B:
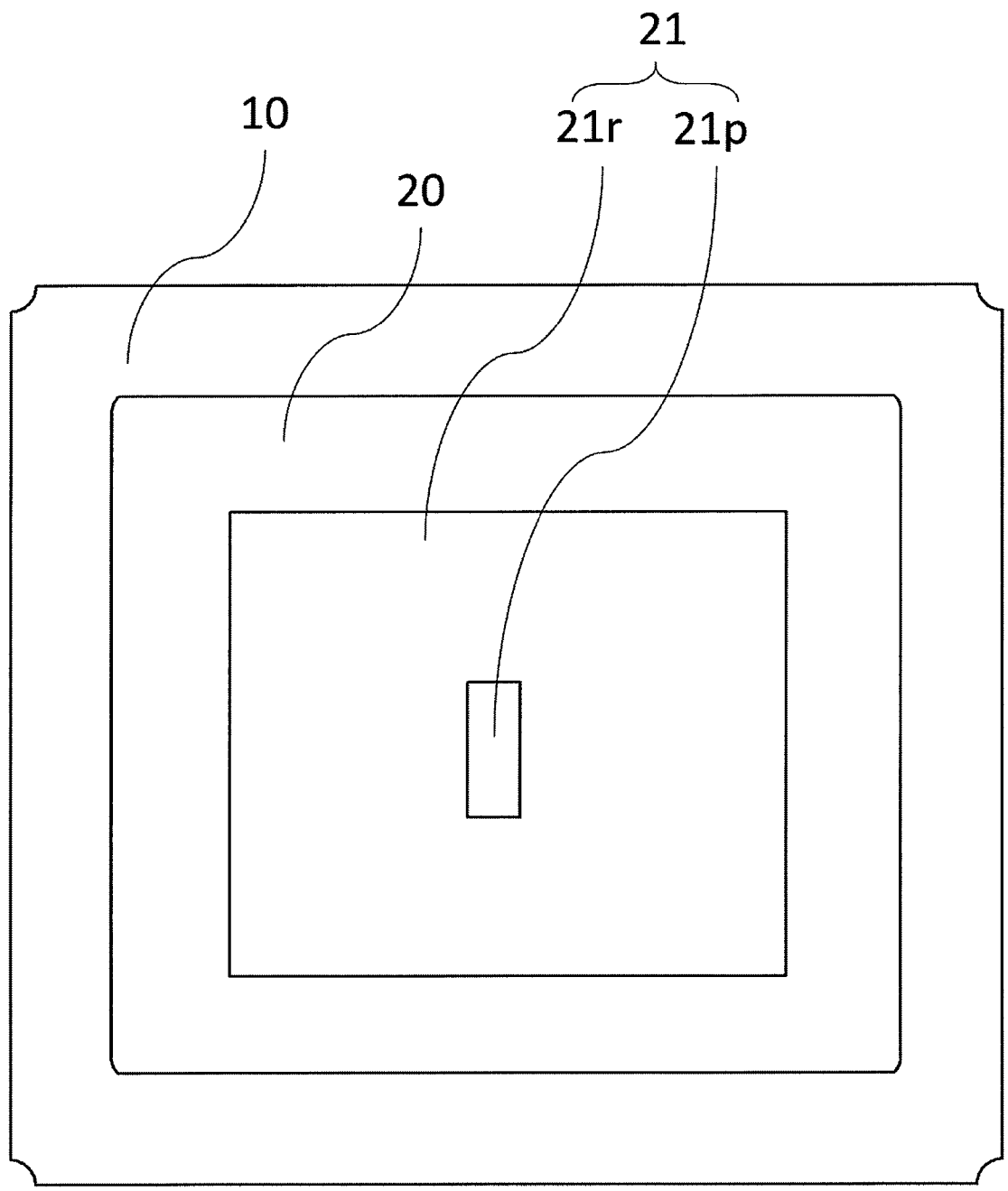
FIG. 11B is a schematic top view of the semiconductor device according to the second embodiment.

FIG. 11B is a top view of the light emitting device 50 in which the package 10 and the light-transmissive member 20 including the wavelength conversion member 21 are bonded to each other. The laser light emitted from the semiconductor laser is reflected at the light-reflecting member 6, becomes white light via a fluorescent material 21p in the wavelength conversion member 21, and is extracted to the outside of the light emitting device.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A method of manufacturing a semiconductor device, the method comprising:
   a providing step comprising providing:
      a package that defines a recess,
      at least one semiconductor laser element disposed in the recess, and
      a light-transmissive member;
   a solder ball forming step comprising forming a plurality of solder balls at intervals on (i) a surface of the package surrounding the recess in which the at least one semiconductor laser element is disposed, or (ii) a surface of the light-transmissive member facing the surface of the package surrounding the recess in which the at least one semiconductor laser element is disposed;
   a pre-securing step comprising bringing (i) the surface of the light-transmissive member facing the surface of the package surrounding the recess, or (ii) the surface of the package surrounding the recess, into contact with an upper surface of the solder balls, which are softened, such that an air passage communicating with the recess is formed between the solder balls; and
   a bonding step comprising reducing a pressure in the recess via the air passage, and thereafter, in a state in which a gas for sealing is injected, heating and pressing the light-transmissive member and the package, to melt the solder balls and bond the light-transmissive member and the package;

wherein the solder ball forming step, the pre-securing step, and the bonding step are performed such that the semiconductor laser element disposed in the recess is sealed by covering the recess with the light-transmissive member.

2. The method of manufacturing a semiconductor device according to claim 1, wherein, in the bonding step, a heating temperature of the package is lower than a heating temperature of the light-transmissive member.

3. The method of manufacturing a semiconductor device according to claim 2, wherein, in the bonding step, the light-transmissive member is heated to a temperature equal to or higher than a melting point of the solder balls.

4. The method of manufacturing a semiconductor device according to claim 3, wherein, in the bonding step, a first pressing element heated at a first temperature is brought into contact with the light-transmissive member, a second pressing element heated at a second temperature lower than the first temperature is brought into contact with the package, and the first pressing element and the second pressing element are pressed, to melt the solder balls and bond the light-transmissive member and the package.

5. The method of manufacturing a semiconductor device according to claim 4, wherein, in the bonding step, a buffer sheet that is elastically deformable between the first pressing element and the light-transmissive member is disposed, and the light-transmissive member is heated and pressed via the buffer sheet.

6. The method of manufacturing a semiconductor device according to claim 4, wherein, in the bonding step, a buffer sheet that is elastically deformable between the second pressing element and the package is disposed, and the package is heated and pressed via the buffer sheet.

7. The method of manufacturing a semiconductor device according to claim 1, wherein the package is a ceramic package.

8. The method of manufacturing a semiconductor device according to claim 1, wherein the solder balls are AuSn solder balls.

9. The method of manufacturing a semiconductor device according to claim 1, wherein, in the pre-securing step, the solder balls are softened at a temperature lower than a melting point of the solder balls.

10. The method of manufacturing a semiconductor device according to claim 1, wherein the at least one semiconductor laser element comprises a first semiconductor laser element configured to emit red laser light, a second semiconductor laser element configured to emit green laser light, and a third semiconductor laser element configured to emit blue laser light.

11. The method of manufacturing a semiconductor device according to claim 1, wherein:

the providing step comprises mounting the semiconductor laser element in the recess via a first bonding member; and in the bonding step, the package is heated and pressed at a temperature lower than a melting point of the first bonding member.

12. The method of manufacturing a semiconductor device according to claim 11, wherein:

the providing step comprises:
  bonding the semiconductor laser element onto a submount with the first bonding member, and
  mounting the submount, on which the semiconductor laser element is bonded, in the recess via a second bonding member; and the bonding step comprises heating and pressing the package at a temperature lower than a melting point of the first bonding member and a melting point of the second bonding member.

13. A method of manufacturing a semiconductor device, the method comprising:

a providing step comprising providing:
  a package that defines a recess,
  at least one semiconductor laser element disposed in the recess, and
  a light-transmissive member;

a solder ball forming step comprising forming a plurality of solder balls at intervals on (i) a surface of the package surrounding the recess in which the at least one semiconductor laser element is disposed, or (ii) a surface of the light-transmissive member facing the surface of the package surrounding the recess in which the at least one semiconductor laser element is disposed; and a bonding step comprising:
  in a state in which the package and the light-transmissive member are separated from each other or integrated with each other such that an air passage is formed between the solder balls, housing the package and the light-transmissive member in a container comprising a supply port for supplying a gas for sealing and an exhaust port for exhausting the gas for sealing, and
  while supplying the gas for sealing to the container, heating the package or the light-transmissive member provided with the solder balls and pressing the package and/or the light-transmissive member, to melt the solder balls and bond a surface of the light-transmissive member and a surface of the package to each other;

wherein the solder ball forming step and the bonding step are performed such that the semiconductor laser element provided in the recess of the package is sealed by covering the recess with the light-transmissive member.

14. The method of manufacturing a semiconductor device according to claim 13, wherein the gas for sealing is supplied at a flow rate of 5 liters or more per minute.

* * * * *